United States Patent
Kang

(10) Patent No.: US 8,334,756 B2
(45) Date of Patent: Dec. 18, 2012

(54) RFID DEVICE

(75) Inventor: Hee Bok Kang, Cheongju (KR)

(73) Assignee: Hynix Semiconductor Inc., Icheon-Si (KR)

(*) Notice: Subject to any disclaimer, the term of this patent is extended or adjusted under 35 U.S.C. 154(b) by 282 days.

(21) Appl. No.: 12/792,467

(22) Filed: Jun. 2, 2010

(65) Prior Publication Data
US 2011/0148596 A1 Jun. 23, 2011

(30) Foreign Application Priority Data
Dec. 23, 2009 (KR) .................. 10-2009-0129395

(51) Int. Cl.
*H04Q 5/22* (2006.01)

(52) U.S. Cl. .................. 340/10.5; 340/10.1; 340/12.34; 340/572.1; 340/13.26; 455/84

(58) Field of Classification Search .................. 340/5.91, 340/10.1, 10.34, 10.5, 12.34, 12.33, 12.5, 340/12.51, 12.37, 13.26, 572.1–572.4, 572.7; 455/84
See application file for complete search history.

(56) References Cited

U.S. PATENT DOCUMENTS

| 6,838,989 | B1* | 1/2005 | Mays et al. | 340/572.1 |
| 2005/0231134 | A1* | 10/2005 | Sid | 315/294 |
| 2007/0046232 | A1* | 3/2007 | Mullet et al. | 318/280 |
| 2007/0170267 | A1* | 7/2007 | Kang et al. | 235/492 |
| 2008/0059849 | A1* | 3/2008 | Ito | 714/718 |
| 2008/0180253 | A1* | 7/2008 | Ovard et al. | 340/572.4 |
| 2008/0266103 | A1* | 10/2008 | Chen et al. | 340/572.7 |

FOREIGN PATENT DOCUMENTS

| KR | 1020090022622 A | 3/2009 |
| KR | 1020090047069 A | 5/2009 |

* cited by examiner

*Primary Examiner* — George Bugg
*Assistant Examiner* — Sharmin Akhter

(57) ABSTRACT

A radio frequency identification (RFID) device includes: a first amplifier configured to amplify a level of a first radio signal applied through a first antenna, and output an amplified signal; a second amplifier configured to amplify the amplified signal to a predetermined level, and output a power signal; a demodulator configured to demodulate the amplified signal and generate a command signal; a transmission switch configured to selectively output the power signal according to a response signal corresponding to the command signal; and a modulator configured to output a second radio signal, which is generated by modulating the power signal, to a second antenna.

14 Claims, 4 Drawing Sheets

RFID DEVICE

CROSS-REFERENCE TO RELATED APPLICATION

The priority based on Korean patent application No. 10-2009-129395, filed on Dec. 23, 2009, the disclosure of which is hereby incorporated in its entirety by reference, is claimed.

BACKGROUND OF THE INVENTION

Embodiment in accordance with the present invention relates to a radio frequency identification (RFID) device which is capable of automatically identifying an object by communicating with an external reader.

An RFID is a contactless identification technology which can automatically identifies an object by using a radio signal. Specifically, an RFID tag is attached to an object to be identified, and the RFID tag communicates with an RFID reader through transmission/reception of a radio signal. In this manner, the identification of the object is achieved. The use of the RFID can overcome the shortcomings of a conventional automatic identification technology, such as a barcode and an optical character recognition technology.

In recent years, RFID tags have been used in various fields, such as a distribution management system, a user authentication system, an electronic cash system, a traffic system, and so on.

For example, a distribution management system performs a commodity classification or an inventory management by using integrated circuit (IC) tags (in which data are recorded) instead of a delivery statement or tag. In another example, a user authentication system performs a room management by using IC cards in which personal information is recorded.

Meanwhile, a memory used in the RFID tag may be implemented with a nonvolatile ferroelectric memory.

In general, a nonvolatile ferroelectric memory (i.e., a ferroelectric random access memory (FeRAM)) is considered by many as a next generation storage device because it has a data processing speed similar to that of a dynamic random access memory (DRAM) and data is retained even when power is interrupted.

The FeRAM has a structure substantially similar to that of the DRAM but uses a ferroelectric capacitor as a storage element. Ferroelectric has a high remnant polarization characteristic. As a result, data is not erased even though an electric field is removed.

FIG. 1 illustrates an overall structure of a general RFID device.

The RFID device includes an antenna unit 1, an analog unit 10, a digital unit 20, and a memory unit 30.

The antenna unit 1 receives a radio signal transmitted from an external RFID reader. The radio signal received through the antenna unit 1 is inputted to the analog unit 10 through antenna pads 11 and 12.

The analog unit 10 amplifies the inputted radio signal and generates a power supply voltage VDD which can then be used as a driving voltage of an RFID tag. The analog unit 10 detects an operation command signal CMD from the inputted radio signal, and outputs the command signal CMD to the digital unit 20. In addition, the analog unit 10 detects the output voltage VDD and outputs a power on reset signal POR and a clock CLK to the digital unit 20. The power on reset signal POR is a signal which controls a reset operation.

The digital unit 20 receives the power supply voltage VDD, the power on reset signal POR, the clock CLK, and the command signal CMD from the analog unit 10, and outputs a response signal RP to the analog unit 10. In addition, the digital unit 20 outputs an address ADD, an input/output data I/O, a control signal CTR, and the clock CLK to the memory unit 30.

The memory unit 30 reads, writes and stores data by using a memory device.

The RFID device uses several frequency bands, and the device characteristics vary depending on the frequency bands. In general, as the frequency band is lowered, the recognition speed of the RFID device becomes slower, and the RFID device operates with a shorter distance and is less influenced by the environment. On the other hand, as the frequency band becomes higher, the recognition speed of the RFID device becomes faster, and the RFID device operates at a longer distance and is greatly influenced by the environment.

When a distance between the external reader and the RFID device is far, a weak radio signal is inputted to the RFID device. The inputted weak radio signal may not reach a level at which a Schottky diode or the like provided inside a demodulator can be driven. In this case, the long-distance recognition performance of the RFID device is deteriorated.

Furthermore, when the conventional RFID device outputs a response signal RP through the antenna unit 1 to the external reader, a radio signal RF is generated by using an internal oscillator provided in the RFID device. In this case, due to the power requirements of the separate internal oscillator, power consumption increases and the circuit of the RFID device becomes complicated.

BRIEF SUMMARY OF THE INVENTION

Various embodiments of the present invention are directed to improving the long-distance recognition performance of an RFID through the detection of a weak input signal by amplifying a radio signal received in an RFID device through a low noise amplifier (LNA) and outputting the amplified radio signal to a demodulator.

Various embodiments of the present invention are directed to providing an RFID device which does not include a separate internal oscillator by generating a radio signal outputted from the RFID device by using a radio signal applied from an external reader to the RFID device.

Various embodiments of the present invention are directed to providing an RFID device capable of controlling display devices such as light emitting diodes (LEDs).

In an embodiment of the present invention, a radio frequency identification (RFID) device includes: an amplifying unit configured to amplify a first radio signal applied through a first antenna, and output a first amplified signal and a second amplified signal; a demodulator configured to demodulate the first amplified signal and provide a command signal; a switch configured to receive the second amplified signal and transmit the second amplified signal according to a response signal corresponding to the command signal; and a modulator configured to receive the second amplified signal from the switch and output a second radio signal to a second antenna.

DESCRIPTION OF EMBODIMENTS

Description of the embodiments of the present invention will now be made in detail with reference to the accompanying drawings. Wherever possible, the same reference numbers will be used throughout the drawings to refer to the same or like elements.

Figure 1:
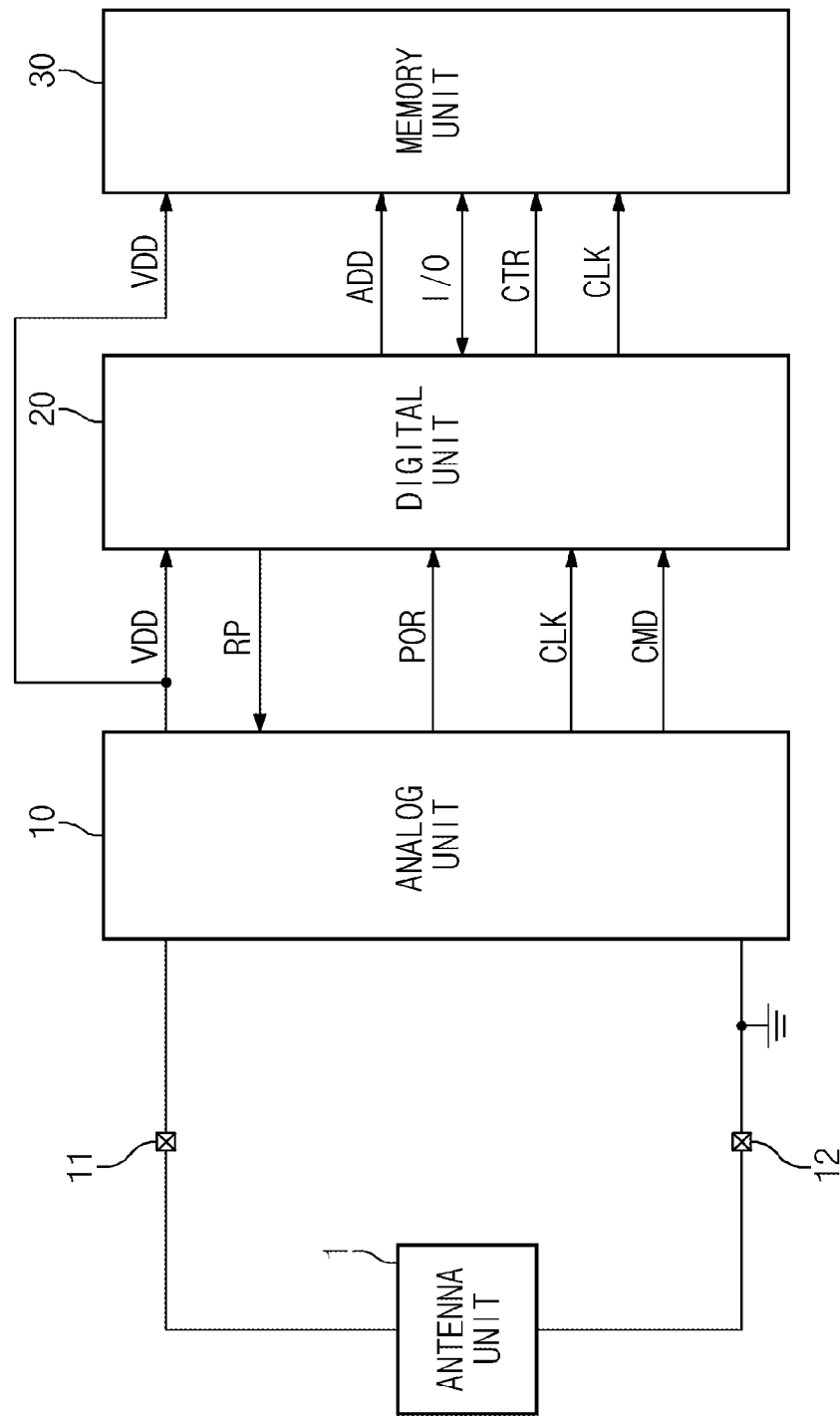
FIG. 1 is a block diagram of a conventional RFID device.
Figure 2:
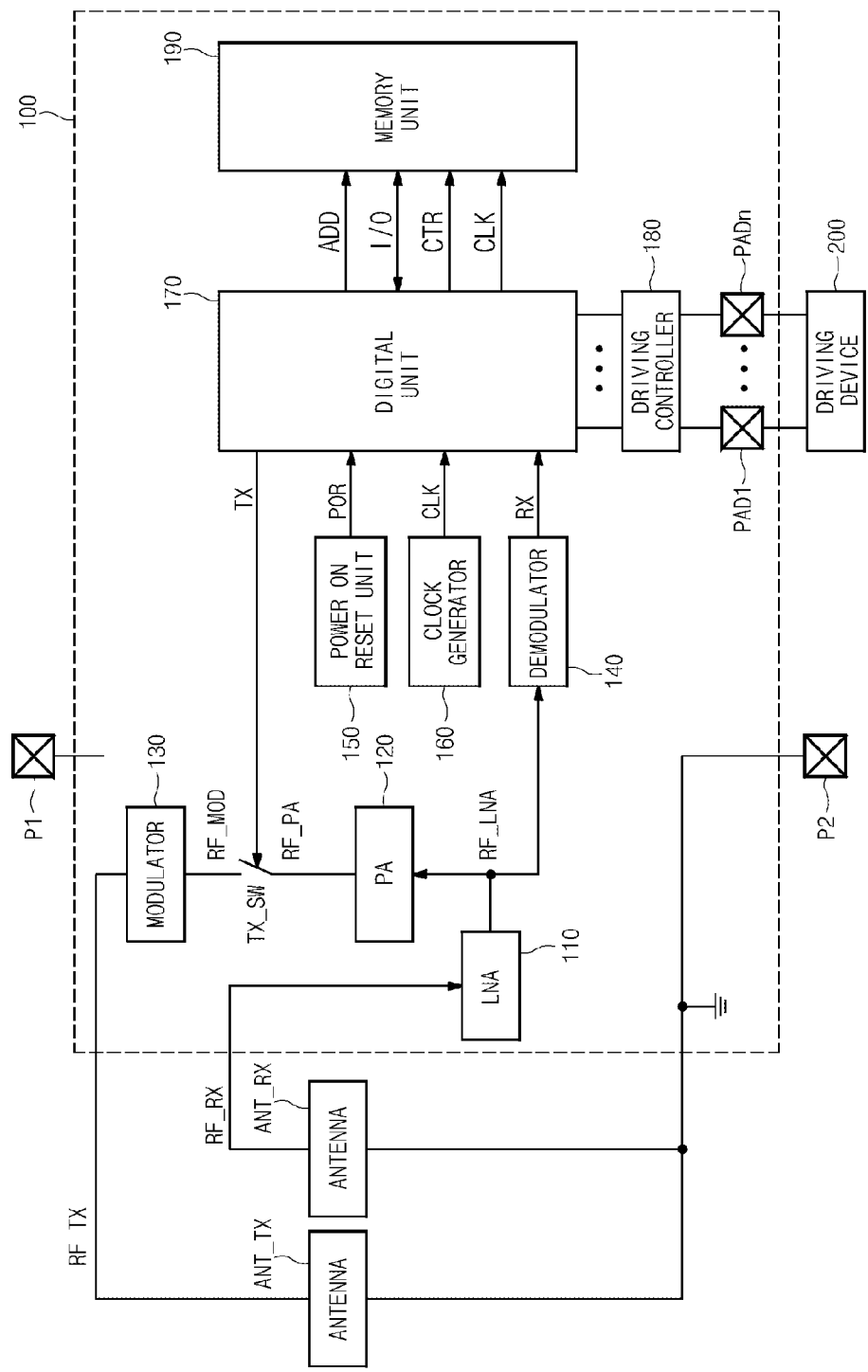
FIG. 2 is a block diagram of an RFID system according to an embodiment of the present invention.

FIG. 2 is a block diagram of an RFID device according to an embodiment of the present invention.

The RFID device 100 according to the embodiment of the present invention includes dual antennas ANT_TX and ANT_RX, a low noise amplifier (LNA) 110, a power amplifier (PA) 120, a modulator 130, a demodulator 140, a power on reset unit 150, a clock generator 160, a digital unit 170, a driving controller 180, a memory unit 190, and a plurality of pads PAD1 to PADn. The low noise amplifier 110 and the power amplifier 120 define an amplifying unit that may include other components.

The plurality of pads PAD1 to PADn are coupled to an external driving device 200. Two independent antennas ANT_RX and ANT_TX are provided for reception and transmission of a radio signal.

The antenna ANT_RX receives a radio signal RF_RX transmitted from an external RFID reader. The radio signal RF_RX received in the RFID device 100 through the antenna ANT_RX is inputted to the LNA 110 through an antenna pad.

The antenna ANT_TX transmits a radio signal RF_TX received from the RFID device 100 to the external RFID reader. The radio signal RF_TX applied from the modulator 130 to the antenna ANT_TX is transmitted to the external RFID reader.

The LNA 110 amplifies the radio signal RF_RX while minimizing added noise. That is, the LNA 110 amplifies a signal while minimizing noise added to the radio signal RF_RX applied through the antenna ANT_RX, and outputs the amplified signal RF_LNA to the PA 120 and the demodulator 140.

The PA 120 amplifies the amplified signal RF_LNA applied from the LNA 110, and outputs the power signal RF_PA to a transmission switch TX_SW.

The transmission switch TX_SW selectively outputs the power signal RF_PA (i.e., modified power signal RF_MOD) to the modulator 130 under the control of a response signal TX applied from the digital unit 170. That is, when the response signal TX is activated, the transmission switch TX_SW outputs the power signal RF_PA (i.e., modified power signal RF_MOD) to the modulator 130. On the other hand, when the response signal TX is deactivated, the transmission switch TX_SW is disconnected from the modulator 130 and thus does not output the power signal RF_PA (i.e., modified power signal RF_MOD) to the modulator 130. By controlling the on/off timing of the response signal TX a desired transmission signal can be generated.

When the response signal TX applied from the digital unit 170 is activated, the modulator 130 outputs the radio signal RF_TX, which is generated by modulating the modified power signal RF_MOD, to the antenna ANT_TX.

The demodulator 140 demodulates the amplified signal RF_LNA from the LNA 110 and outputs a command signal RX to the digital unit 170.

Also, the power on reset unit 150 detects a power supply voltage VDD generated at a power supply voltage pad P1, and outputs a power on reset signal POR to the digital unit 170. The power on reset signal POR is a signal which controls a reset operation.

The power on reset signal POR rises with the power supply voltage while the power supply voltage goes from a low level to a high level. The power on reset signal POR then changes from a high level to a low level at the moment that the power supply voltage reaches the power supply voltage level VDD, thereby resetting an internal circuit of the RFID device 100.

The clock generator 160 supplies the digital unit 170 with a clock CLK which controls an operation of the digital unit 170.

In this embodiment, the RFID device 100 is driven by the external power supply voltage pad P1 and an external ground voltage pad P2. In a conventional RFID device, an RFID tag receives a radio signal through communication with the RFID reader. The radio signal then supplies the power supply voltage through a voltage amplification unit provided inside the RFID tag.

In this embodiment, however, a large amount of power is consumed because the RFID device 100 is coupled to the external driving device 200. Accordingly, in this embodiment, the power supply voltage VDD and a ground voltage GND are supplied to the RFID device 100 through the additional external power supply voltage pad P1 and the additional ground voltage pad P2.

The digital unit 170 receives the power supply voltage VDD, the power on reset signal POR, the clock CLK, and the command signal RX, interprets the command signal RX, and generates a control signal and processing signals. The digital unit 170 outputs the response signal RP corresponding to the control signal and the processing signals to the transmission switch TX_SW. Also, the digital unit 170 outputs an address ADD, data I/O, the control signal CTR, and the clock CLK to the memory unit 190.

The driving controller 180 is coupled between the digital unit 170 and the plurality of pads PAD1 to PADn. The driving controller 180 outputs driving signals, which control an operation of the driving device 200 provided outside the RFID device 100, to the plurality of pads PAD1 to PADn according to the command signal applied from the digital unit 170. The driving device 200 is coupled to the driving controller 180 of the RFID device 100 through the plurality pads PAD1 to PADn.

The plurality of pads PAD1 to PADn are coupled to the external driving device 200 through connection pins, and correspond to a coupling unit which couples the RFID device 100 and the driving device 200 to each other. The driving device 200 corresponds to a driving control device which controls an operation of a display device such as an LED, a motor, or a speaker.

The memory unit 190 may be implemented with a nonvolatile ferroelectric memory (FeRAM). The FeRAM has a data processing speed similar to that of a DRAM. Also, the FeRAM has a structure substantially similar to that of the DRAM. The FeRAM uses a ferroelectric material as a capacitor, so that it has a high remnant polarization characteristic which is a characteristic of the ferroelectric material. Due to the remnant polarization characteristic, data is not erased even though an electric field is removed.

Figure 3:
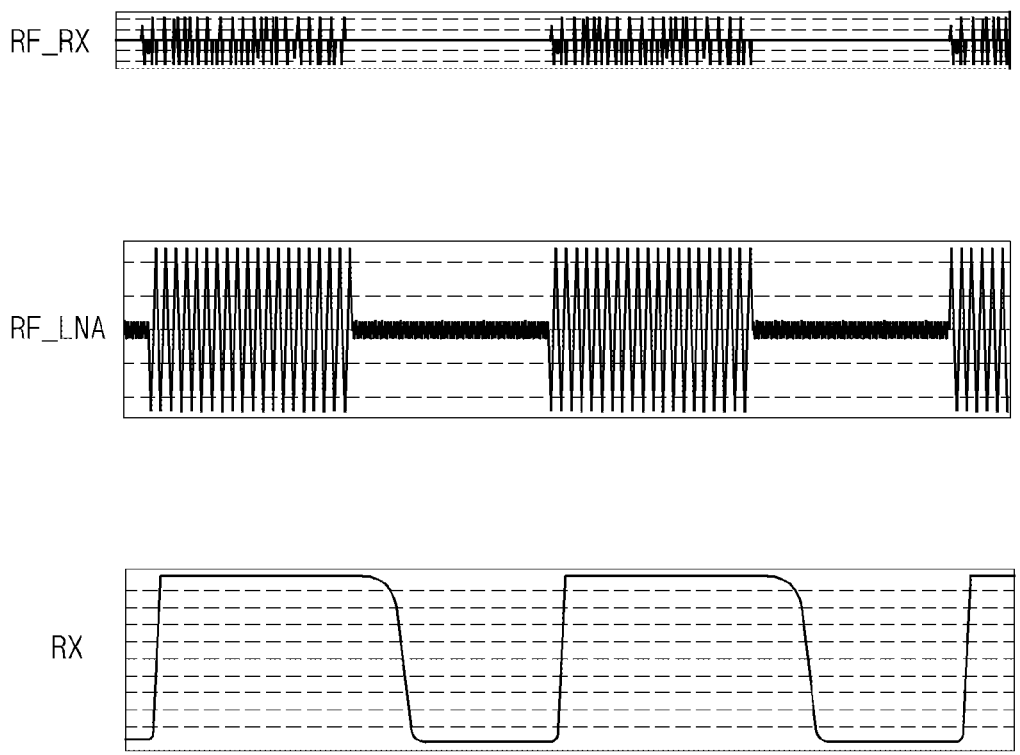
FIGS. 3 and 4 are waveform diagrams showing an operation of the RFID device according to an embodiment of the present invention.
Figure 4:
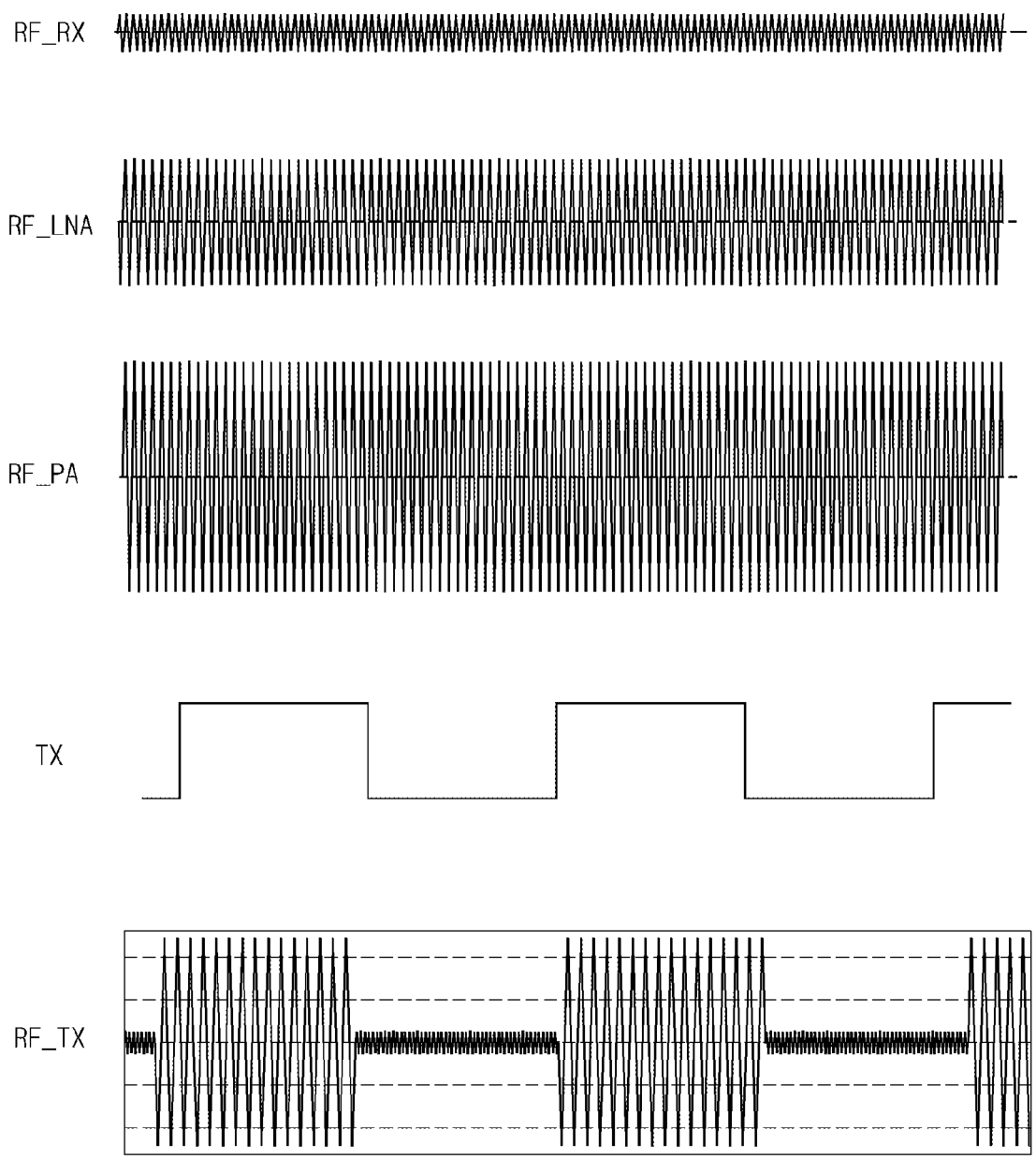

FIGS. 3 and 4 are waveform diagrams showing the operation of the RFID device 100 according to an embodiment of the present invention. Specifically, FIG. 3 is a waveform diagram showing a case in which the command signal RX is applied to the RFID device 100.

As seen in FIG. 3, the radio signal RF_RX is received through the antenna ANT_RX. The radio signal RF_RX received in the RFID device 100 through the antenna ANT_RX is applied to the LNA 110.

Subsequently, the LNA 110 amplifies the radio signal RF_RX from the antenna ANT_RX, and outputs the amplified signal RF_LNA to the PA 120 and the demodulator 140.

The radio signal RF_RX from the antenna ANT_RX is very weak. At this point it may be impossible to drive a Schottky diode included in the demodulator 140. Accordingly, the LNA 110 amplifies the radio signal RF_RX and generates the amplified signal RF_LNA having a voltage level at which the Schottky diode included in the demodulator 140 can be driven.

The demodulator 140 demodulates the amplified signal RF_LNA applied from the LNA 110, and outputs the command signal RX to the digital unit 170. That is, the demodulator 140 detects the command signal RX by using an envelope detector implemented with the Schottky diode.

FIG. 4 is a waveform diagram showing a case in which the response signal TX is outputted from the RFID device 100. As seen in FIG. 4, the radio signal RF_RX is received through the antenna ANT_RX. At this time, the radio signal RF_RX may have a constant frequency, regardless of a change in the input signal. The radio signal RF_RX received in the RFID device 100 from the antenna ANT_RX is applied to the LNA 110.

Subsequently, the LNA 110 amplifies the radio signal RF_RX from the antenna ANT_RX, and outputs the amplified signal RF_LNA to the PA 120 and the demodulator 140. The PA 120 amplifies the amplified signal RF_LNA from the LNA 120, and outputs the amplified power signal RF_PA to the transmission switch TX_SW.

The transmission switch TX_SW selectively outputs the power signal RF_PA (i.e., modified power signal RF_MOD) to the modulator 130 under the control of the response signal TX applied from the digital unit 170. That is, when the response signal TX is activated to a high level, the transmission switch TX_SW is turned on to output the power signal RF_PA (i.e., modified power signal RF_MOD) to the modulator 130.

On the other hand, when the response signal TX is deactivated to a low level, the transmission switch TX_SW is disconnected from the modulator 130 and thus does not output the power signal RF_PA to the modulator 130 (i.e., modified power signal RF_MOD is low).

The modulator 130 modulates the modified power signal RF_MOD and outputs the modulated modified power signal as the radio signal RF_TX. The antenna ANT_TX transmits the radio signal RF_TX applied from the modulator 130 to the external RFID reader.

As described above, when outputting the response signal TX to the antenna ANT_TX, the radio signal RF_TX is generated by using the radio signal RF_RX applied through the antenna ANT_RX, without using an internal oscillator of the RFID device 100.

That is, the radio signal RF_RX sent from the external RFID reader is amplified by using the LNA 110 and the PA 120, and transmitted to the external RFID reader by using the separate antenna ANT_TX.

In this case, the radio signal RF_RX applied from the external RFID reader and the radio signal RF_TX outputted to the external RFID reader through the modulator 130 may have the same frequency. The radio signal RF_TX is a signal which is generated by amplifying the voltage level of the radio signal RF_RX through the LNA 110 and the PA 120.

In recent years, lighting installed in buildings are using a plurality of LEDs. In this case, a specific light pattern can be provided by individually controlling on/off operations of the LEDs. Furthermore, a desired brightness can be provided by controlling individual LEDs among the plurality of lights, or lights positioned at desired locations can be separately controlled.

In the above-described lighting controlling method, the lighting can be remotely controlled through the RFID device. Specifically, an RFID tag is attached to an LED device, and a desired signal is transmitted over a radio frequency through an external reader. The RFID tag attached to the LED device recognizes the transmitted signal and receives a separate command according to a unique ID. In this way, the number and brightness of the LEDs can be controlled as desired.

Such an RFID tag is relatively cheaper than a general wireless remote controller. Hence, in a case where the RFID tag is applied to the lightings or the like, the implementation costs can be reduced and more options can be provided to users.

The embodiments of the present invention provide the following effects.

The long-distance recognition performance of the RFID can be improved through the detection of the weak input signal by amplifying the radio signal received in the RFID device through the LNA and outputting the amplified radio signal to the demodulator.

Moreover, since the radio signal outputted from the RFID device is generated by using the radio signal applied from the external RFID reader to the RFID device, a separate internal oscillator may be omitted from the RFID device.

In this case, the configuration of the RFID device can be simplified and the operating voltage can be reduced. Also, the operating characteristics can be improved.

The above embodiments of the present invention are illustrative and not limitative. Various alternatives and equivalents are possible. Other additions, subtractions, or modifications are obvious in view of the present disclosure and are intended to fall within the scope of the appended claims.

What is claimed is:

1. A radio frequency identification (RFID) device comprising:
    an amplifying unit configured to amplify a first radio signal applied through a first antenna, and output a first amplified signal and a second amplified signal;
    a demodulator configured to demodulate the first amplified signal and provide a command signal;
    a switch configured to receive the second amplified signal and transmit the second amplified signal according to a response signal corresponding to the command signal; and
    a modulator configured to receive the second amplified signal from the switch and output a second radio signal to a second antenna,
    wherein the switch transmits the second amplified signal to the modulator when the response signal is an activation signal, and does not transmit the second amplifier signal to the modulator when the response signal is a deactivation signal.

2. The RFID device according to claim 1, wherein the first radio signal and the second radio signal have substantially the same frequency.

3. The RFID device according to claim 1, wherein the amplifying unit comprises:
    a first amplifier configured to amplify the first radio signal applied through the first antenna and output the first amplified signal; and
    a second amplifier configured to amplify the first amplified signal to a predetermined level and output the second amplified signal, the second amplified signal being a power signal, and
    wherein the first and second amplifiers are coupled in series.

4. The RFID device according to claim 3, wherein the first amplifier comprises a low noise amplifier (LNA).

5. The RFID device according to claim 1, further comprising:
 a power supply voltage pad configured to supply a power supply voltage to the RFID device; and
 a ground voltage pad configured to supply a ground voltage to the RFID device.

6. The RFID device according to claim 1, further comprising:
 a digital unit configured to generate a control signal and the response signal according to the command signal;
 a coupling unit coupled to a driving device provided outside the RFID device; and
 a driving controller configured to output a driving signal, which controls an operation of the driving device according to the control signal, to the coupling unit.

7. The RFID device according to claim 6, wherein the coupling unit comprises a pad coupled between the driving device and the driving controller.

8. The RFID device according to claim 6, further comprising a memory unit configured to perform a data read or write operation according to processing signals applied from the digital unit.

9. The RFID device according to claim 8, wherein the memory unit comprises a nonvolatile ferroelectric memory.

10. The RFID device according to claim 6, further comprising:
 a power on reset unit configured to generate and output a power on reset signal to the digital unit; and
 a clock generator configured to generate and output a clock signal to the digital unit.

11. The RFID device according to claim 6, wherein the driving device is configured to control an operation of a light emitting diode (LED).

12. The RFID device according to claim 6, wherein the driving device is configured to control an operation of a motor.

13. The RFID device according to claim 6, wherein the driving device is configured to control an operation of a speaker.

14. The RFID device according to claim 1, wherein the switch operates regardless of the first radio signal applied through the first antenna.

* * * * *